United States Patent
Kim

(10) Patent No.: US 8,027,647 B2
(45) Date of Patent: Sep. 27, 2011

(54) BROADCASTING RECEIVING APPARATUS AND METHOD THEREOF

(75) Inventor: Jong Woon Kim, Buk-gu (KR)

(73) Assignee: LG Innotek Co., Ltd., Seoul (KR)

( * ) Notice: Subject to any disclaimer, the term of this patent is extended or adjusted under 35 U.S.C. 154(b) by 822 days.

(21) Appl. No.: 11/913,300

(22) PCT Filed: Feb. 16, 2007

(86) PCT No.: PCT/KR2007/000870
§ 371 (c)(1),
(2), (4) Date: Oct. 31, 2007

(87) PCT Pub. No.: WO2007/097554
PCT Pub. Date: Aug. 30, 2007

(65) Prior Publication Data
US 2008/0160948 A1    Jul. 3, 2008

(30) Foreign Application Priority Data
Feb. 20, 2006 (KR) .......... 10-2006-0016158

(51) Int. Cl.
*H04B 1/44* (2006.01)
(52) U.S. Cl. .......... 455/83; 455/217; 455/78; 455/250.1
(58) Field of Classification Search .......... 455/83, 455/217, 78, 250.1
See application file for complete search history.

(56) References Cited

U.S. PATENT DOCUMENTS 6,195,535 B1 * 2/2001 Kurchuk .......... 455/83

FOREIGN PATENT DOCUMENTS

| JP | 10-322170 A | 12/1998 |
| JP | 2003-051712 | 2/2003 |
| JP | 2004-214939 A | 7/2004 |
| JP | 2006-279212 | 10/2006 |
| KR | 10-1995-0030502 | 11/1995 |
| KR | 10-2001-0037870 | 5/2001 |

OTHER PUBLICATIONS

Office Action dated Aug. 2, 2011 in Japanese Application No. 2008-0555168, filed Feb. 16, 2007.

* cited by examiner

*Primary Examiner* — Nay Maung
*Assistant Examiner* — Richard Chan
(74) *Attorney, Agent, or Firm* — Saliwanchik, Lloyd & Eisenschenk

(57) ABSTRACT

Provided are a broadcasting receiving apparatus and a broadcasting receiving method using the same. The broadcasting receiving apparatus including: a low noise amplifying unit low-noise-amplifying an RF signal received from an antenna; an RF attenuating unit attenuating the received RF signal to output the attenuated RF signal; a supply unit supplying a DC voltage to the low noise amplifying unit; and a control unit controlling an output of the DC voltage depending on a change of an electric field strength of the received signal.

7 Claims, 1 Drawing Sheet

_US 8,027,647 B2_

BROADCASTING RECEIVING APPARATUS AND METHOD THEREOF

CROSS-REFERENCE TO RELATED APPLICATION

This application is the U.S. national stage application of International Patent Application No. PCT/KR2007/000870, filed Feb. 16, 2007, the disclosure of which is hereby incorporated by reference in its entirety.

TECHNICAL FIELD

The embodiment of the present invention relates to a broadcasting receiving apparatus and method using the same.

BACKGROUND ART

Generally, broadcasting receiving apparatuses receive a broadcasting signal through an antenna and select a frequency band of a channel selected by a user to display a broadcasting program of the selected channel.

The broadcasting receiving apparatuses include an RF (Radio Frequency) receiving terminal receiving the broadcasting signal converted into an electrical signal using the antenna and a tuner selecting the frequency band of the channel selected by the user among different frequency bands transmitted from each of broadcasting stations.

A radio wave received at an RF receiving terminal has a very low power level due to an influence of attenuation and noise. Therefore, the RF receiving terminal requires a procedure of amplifying the received signal. However, when the received signal is amplified, a noise signal as well as a desired signal is amplified due to an external noise included in the received signal. What is therefore required is a function of minimizing the noise while amplifying the received signal.

In order to satisfy the function of minimizing the noise while amplifying the received signal at the RF receiving terminal, a Low Noise Amplifier (LNA) has been developed. The low noise amplifier is designed to have low noise figure by adjusting an operation point and a matching point.

Characteristics of a low noise ratio and a high amplification degree are required in the LNA.

The RF receiving terminal includes an RF attenuator for attenuating a signal amplified by the LNA to a signal having a predetermined level. The RF attenuator is included in an input terminal of the tuning unit. The RF attenuator attenuates an RF signal inputted according to a variable gain voltage of an automatic gain controller (ACC) producing a feedback control signal.

However, a path supplying a power to a line connected to the LNA is not provided in the RF attenuator. Therefore, the LNA is not effectively controlled. Thus, extension of a receive sensitivity range is impossible and stable receive sensitivity according to a received field strength (a weak electric field or a strong electric field) is not maintained.

DISCLOSURE OF INVENTION

Technical Problem

An embodiment of the present invention provides a broadcasting receiving apparatus and method.

An embodiment of the present invention provides a broadcasting receiving apparatus in which a supply unit is connected in parallel to both sides of an RF attenuating unit to supply a DC voltage necessary for a low noise amplifier, and a broadcasting receiving method using the same.

An embodiment of the present invention provides a broadcasting receiving apparatus that can extend a receive sensitivity arrange and maintain a stable receive sensitivity, and a broadcasting receiving method using the same.

Technical Solution

An embodiment of the present invention provides a broadcasting receiving apparatus, comprising: a low noise amplifying unit low-noise-amplifying an RF signal received from an antenna; an RF attenuating unit attenuating the received RF signal to output the attenuated RF signal; a supply unit supplying a DC voltage to the low noise amplifying unit; and a control unit controlling an output of the DC voltage depending on a change of an electric field strength of the received signal.

An embodiment of the present invention provides a broadcasting receiving apparatus, comprising: an antenna unit including a low noise amplifying unit; and a tuner attenuating a signal received from the antenna unit according to a level of an automatic gain control voltage, amplifying the attenuated signal to a signal having a predetermined level, and passing a desired frequency band, wherein the tuner comprises a supply unit supplying a DC voltage to the low noise amplifying unit.

An embodiment of the present invention provides a broadcasting receiving method, comprising: determining a received signal strength; outputting a DC voltage to an RF output terminal of an RF attenuating unit when a received signal has a weak electric field strength; transmitting the DC voltage from a supply unit through an RF input terminal to a low noise amplifying unit; and operating the low noise amplifying unit to low-noise-amplify the received signal and output the amplified signal.

ADVANTAGEOUS EFFECTS

In a broadcasting receiving apparatus and a broadcasting receiving method according to an embodiment of the present invention, extension of a receive sensitivity range and stable receive sensitivity are maintained by adjusting an electric field strength of a received signal through an active control of a low noise amplifier.

BEST MODE FOR CARRYING OUT THE INVENTION

Hereinafter, a broadcasting receiving apparatus according to embodiments of the present invention will be described with reference to the accompanying drawings.

Figure 1:
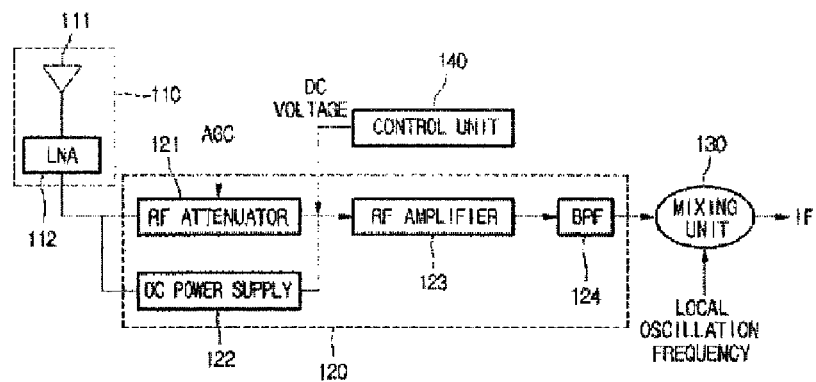
FIG. 1 is a block diagram of a broadcasting receiving apparatus according to an embodiment of the present invention.

FIG. 1 is a block diagram of a broadcasting receiving apparatus according to an embodiment of the present invention.

Referring to FIG. 1, the broadcasting receiving apparatus includes an antenna unit 110, a tuner 120, a mixing unit 130 and a control unit 140. The antenna unit 110 includes an antenna 111 and a low noise amplifier (LNA) 112. The LNA 112 having characteristics of a low noise ratio and a high amplification degree is selectively operated. Also, the LNA 112 low-noise-amplifies an RF signal received from the antenna 111.

The LNA 112 is selectively operated by a DC voltage supplied from the control unit 140 or a set. The low noise amplification is performed when the incoming RF signal has a weak electric field strength. The LNA is turned off to bypass the incoming RF signal when the incoming RF signal has a strong electric field strength. A bypass path is electrically provided to or around the LNA 112.

The tuner 120 includes an RF attenuator 121 connected to an RF input terminal RF-IN, a voltage supply 122, and RF amplifier 123, and a band-pass filter (BPF) 124. The RF attenuator 121 attenuates the RF signal received from the RF input terminal RF-IN according to a gain voltage of an automatic gain control (AGC) to output the attenuated signal to a signal with a predetermined level. The RF attenuator 121 may be disposed between the tuner 120 and the antenna unit 110.

The voltage supply 122 is connected in parallel to the RF attenuator 121 and transmits the DC voltage received from the control unit 140 to the RF attenuator 121. The voltage supply 122 may be included in the RF attenuator 121 because the voltage supply 122 is electrically connected in parallel to both ends of the RF attenuator 121.

The RF amplifier 123 amplifies a signal passing through the RF attenuator 121 to a signal having a predetermined level. The BPF 124 passes a frequency band corresponding to a selected channel.

The mixing unit 130 mixes an RF signal outputted from the tuner 120 with a local oscillation frequency to convert the mixed frequency into an intermediate frequency and output the intermediate frequency.

The control unit 140 determines a strength of a signal received from the antenna 111. As this result, when the received signal has the weak electric field strength, the control unit 140 outputs a DC voltage for operating the LNA 112 to improve receive sensitivity. When the received signal has the strong electric field strength, the control unit 140 controls such that the LNA 112 is turned off. The control unit 140 checks a user's key input or an AGC signal of the AGC to determine the strength of the received signal.

The antenna unit 110 receives the DC voltage to amplify the received signal using the LNA 112 or bypass the received signal when supply of the DC voltage is stopped. Also, the antenna unit 110 extracts a control signal at the LNA 112 and then amplifies the received signal depending on an amplification degree to output the amplified signal when the incoming DC voltage including the control signal of a low frequency (less than several hundreds KHz) is provided.

Figure 2:
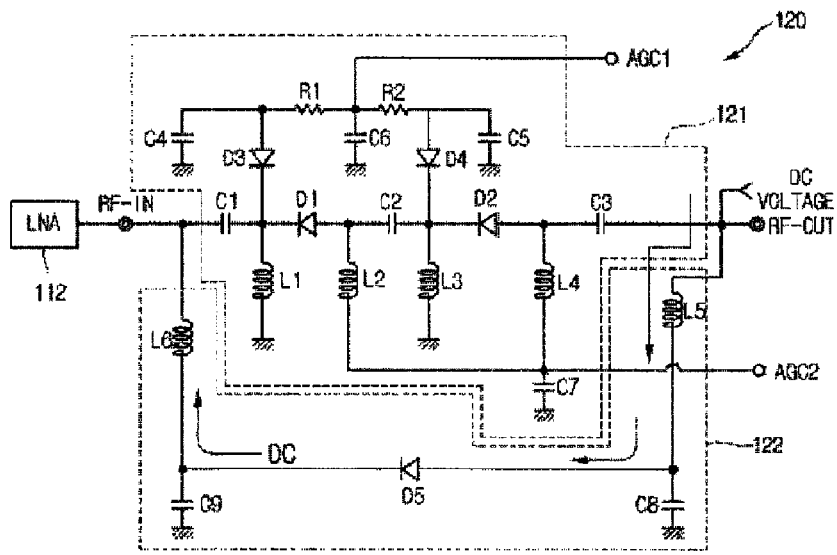
FIG. 2 is a schematic circuit diagram of an RF attenuator and a voltage according to an embodiment of the present invention.

FIG. 2 is a schematic circuit diagram of an RF attenuator and a voltage supply according to an embodiment of the present invention.

Referring to FIG. 2, the RF attenuator 121 connects an RF signal received through the LNA 112 or the bypass path to an RF output terminal RF-OUT through a first connecting capacitor C 1, a first PIN diode D1, a second connecting capacitor C2, a second PIN diode D2, and a third connecting capacitor C3.

A first automatic gain control signal AGC1 is connected to cathode terminals of the first PIN diode D1 and the second PIN diode D2 through third and fourth PIN diodes D3 and D4, and bias resistances R1 and R2. A second automatic gain control signal AGC2 is connected to anode terminals of the first PIN diode D1 and the second PIN diode D2 through choke coils L2 and L4.

The choke coil L1 is connected to cathode terminals of the first PIN diode D1 and the third PIN diode D3, and one side of the capacitor C1. The choke coil L3 is connected to cathode terminals of the first PIN diode D2 and the fourth PIN diode D4, and one side of the capacitor C2. The bypass capacitors C4 and C6, in which the other sides are grounded, are connected to both sides, respectively, of resistance R1. The bypass capacitors C5 and C6, in which the other sides are grounded, are connected to both sides, respectively, of resistance R2. The bypass capacitors C4 and C5, in which the other sides are grounded, also respectively connect to the anode terminals of the third PIN diode D3 and fourth PIN diode D4. A bypass capacitor C7, in which one side is grounded, is connected to one side of the choke coils L2 and L4.

The voltage supply 122 where the DC voltage of the control unit is feed back is connected in parallel between the RF output terminal RF-OUT and the RF input terminal RF-IN. The voltage supply 122 feeds back the DC voltage received from the RF output terminal RF-OUT to the RF input terminal RF-IN.

The voltage supply 122 includes a coil L5 connected to the RF output terminal RF-OUT, a coil L6 connected to the RF input terminal RF-IN, a diode D5 where an anode terminal is connected to the coil L5 and a cathode terminal is connected to the coil L6, and bypass capacitors C8 and C9.

The coil L5 intercepts an RF signal outputted to the RF output terminal RF-OUT and passes the DC voltage inputted from the RF output terminal RF-OUT. The diode D5 intercepts a current flowing in a reverse direction. The coil L6 intercepts the RF signal inputted from the RF input terminal RF-IN and passes the DC voltage inputted through the diode D5. One side of the bypass capacitors C8 and C9 is connected to both sides, respectively, of the diode D5 and the other side of the bypass capacitors C8 and C9 is grounded to bypass a DC signal to ground terminals.

The RF signal received from the RF input terminal RF-IN is outputted to the RF output terminal RF-OUT through the first connecting capacitor C1, the first PIN diode D1, the second connecting capacitor C2, the second PIN diode D2, and the third connecting capacitor C3.

The coils L5 and L6 of the voltage supply 122 intercept the RF signal received from the RF input terminal RF-IN and the RF signal outputted to the RF output terminal RF-OUT.

The RF signal outputted to the RF output terminal RF-OUT is attenuated according to resistance values of the third and fourth PIN diodes D3 and D4, and the first and second PIN diodes D1 and D2 associated with variable voltages of the first automatic gain control signal AGC1 and the second automatic gain control signal AGC2, respectively.

The voltage supply 122 receives the DC voltage of the control unit 140 inputted to the RF output terminal RF-OUT of the RF attenuator 121. The DC voltage of the RF output terminal RF-OUT is intercepted by the third connecting capacitor C3 and outputted to the RF input terminal RF-IN through the coil L5, the diode D5, and the coil L6 of the voltage supply 122. The DC voltage of the RF output terminal RF-OUT is supplied to the LNA 112 of the antenna unit 110 connected to the RF input terminal RF-IN. Therefore, the LNA 112 is operated by the inputted DC voltage.

Receive sensitivity of a signal having the weak electric field strength is improved by amplifying the signal using the LNA 112 of the antenna unit 110 and inputting the amplified signal to the tuner 120. On the contrary, the receive sensitivity of a signal having a strong electric field strength can be adjusted by adjusting an attenuation degree according to a received signal level at the diodes D1, D2, D3, and D4 and peripheral circuits of the RF attenuator 121. Accordingly, a reception range against a change of an electric field strength may be extended. Therefore, a receive sensitivity range is extended. Also the tuner 120 may be stably operated.

Figure 3:
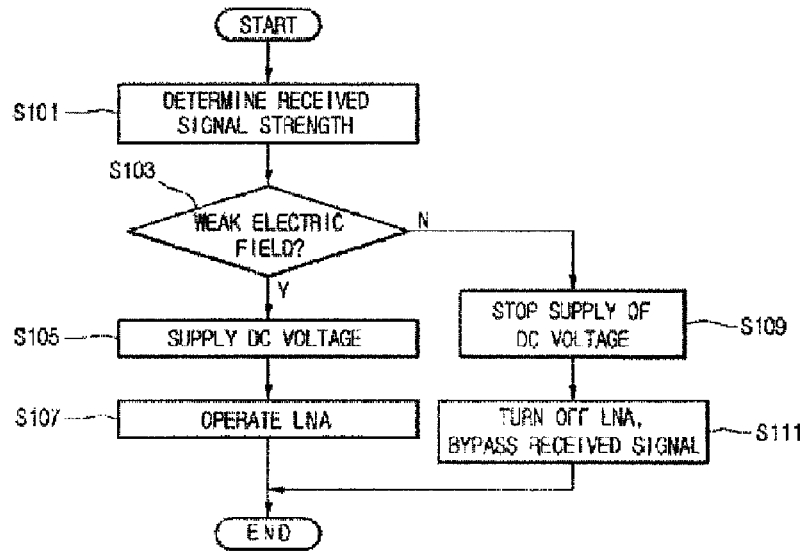
FIG. 3 is a flowchart illustrating a broadcasting receiving method according to an embodiment of the present invention.

FIG. 3 is a flowchart illustrating a broadcasting receiving method according to an embodiment of the present invention.

Referring to FIG. 3, a received signal strength is determined by a user's key input or an AGC voltage in operation S101. When the received signal has a weak electric field strength in operation S103, a DC voltage is supplied through the voltage supply connected in parallel to the RF attenuator in operation S105 and the LNA connected to the RF input terminal RF-IN is operated in operation S107. A receive sensitivity is improved by amplifying a received signal using the LNA.

The LNA may simply amplify the received signal by a DC voltage or may amplify the received signal to a signal having a predetermined level by a DC voltage including a control signal of a low frequency (less than several hundreds KHz).

In operation S109, supply of the DC voltage applied through the voltage supply is stopped when the received signal have not the weak electric field strength. Therefore, the LNA is turned off and the received signal is bypassed through a bypass path in operation S111.

The extension of the receive sensitivity range and the stable receive sensitivity using the LNA are maintained by actively controlling the antenna unit.

It will be apparent to those skilled in the art that various modifications and variations can be made in the present invention. Thus, it is intended that the present invention covers the modifications and variations of this invention provided they come within the scope of the appended claims and their equivalents.

INDUSTRIAL APPLICABILITY

In a broadcasting receiving apparatus and method using the same according to embodiments of the present invention, an electric field strength of a received signal is adjusted by actively controlling the LNA to maintain an extension of a receive sensitivity range and stable receive sensitivity.

The invention claimed is:

1. A broadcasting receiving apparatus comprising:
a low noise amplifying unit for low-noise-amplifying an RF signal received from an antenna;
an RF attenuating unit for attenuating the received RF signal to output the attenuated RF signal;
a supply unit for supplying a DC voltage to the low noise amplifying unit; and
a control unit for controlling to output the DC voltage when the received RF signal has a weak electric field strength,
wherein the low noise amplifying unit is capable of amplifying the received RFF signal when the DC voltage is supplied, and the low noise amplifying unit is turned off and the received RF signal is bypassed when supply of the DC voltage is stopped,
wherein the supply unit comprises: a first coil connected to an RF output terminal of the RF attenuating unit and capable of passing an incoming DC voltage; a second coil connected to an RF input terminal of the RF attenuating unit and capable of passing the incoming DC voltage; a diode connected in series between the first coil and second coil for intercepting a current flowing in a reverse direction; a first bypass capacitor having one end grounded and the other end connected to a first side of the diode; and a second bypass capacitor having one end grounded and the other end connected to a second side of the diode.

2. The broadcasting receiving apparatus according to claim 1, wherein the DC voltage includes a control signal capable of adjusting an amplification degree of the low noise amplifying unit.

3. The broadcasting receiving apparatus according to claim 1. wherein the RF attenuating unit attenuates the received RF signal having a strong electric field strength according to a level of an automatic gain control signal.

4. The broadcasting receiving apparatus according to claim 1, further comprising a tuner, wherein the tuner comprises:
the RF attenuating unit at an RF input terminal; and
an RF amplifier for amplifying the attenuated RF signal.

5. The broadcasting receiving apparatus according to claim 1, wherein the supply unit is connected in parallel to the RF attenuating unit.

6. A broadcasting receiving apparatus comprising:
an antenna unit including a low noise amplifying unit; and
a tuner capable of attenuating a signal received from the antenna unit according to a level of an automatic gain control voltage, amplifying the attenuated signal to a signal having a predetermined level, and passing a desired frequency band,
wherein the tuner comprises a supply unit for supplying a DC voltage to the low noise amplifying unit when the signal received from the antenna unit has a weak electric field strength,
wherein the low noise amplifying unit is capable of amplifying the received signal when the DC voltage is supplied, and the low noise amplifying unit is turned off and the received signal is bypassed when supply of the DC voltage is stopped,
wherein the supply unit is connected in parallel to an RF attenuating unit to supply the DC voltage received through an RF output terminal of the RF attenuating unit to the low noise amplifying unit,
wherein the supply unit comprises: a first coil connected to the RF output terminal of the RF attenuating to receive the DC voltage; a second coil connected to an RF input terminal of the RF attenuating unit to output the DC voltage to the low noise amplifying unit; a diode connected in series between the first coil and the second coil to intercept a current flowing in a reverse direction; a first bypass capacitor having one end grounded and the other end connected to a first side of the diode; and a second bypass capacitor having one end grounded and the other end connected to a second side of the diode.

7. The broadcasting receiving apparatus according to claim 6, wherein the tuner further comprises:
the RF attenuating unit for attenuating an RF signal according to the level of the automatic gain control voltage;
an RF amplifying unit for amplifying the attenuated RF signal to the signal having the predetermined level; and
a filter unit for passing the frequency band corresponding to the selected channel.

* * * * *